United States Patent
Motonami et al.

[11] Patent Number: 5,888,851
[45] Date of Patent: Mar. 30, 1999

[54] METHOD OF MANUFACTURING A SEMICONDUCTOR DEVICE HAVING A CIRCUIT PORTION AND REDUNDANT CIRCUIT PORTION COUPLED THROUGH A MELTABLE CONNECTION

[75] Inventors: Kaoru Motonami; Masao Nagatomo, both of Hyogo-ken, Japan

[73] Assignee: Mitsubishi Denki Kabushiki Kaisha, Tokyo, Japan

[21] Appl. No.: 74,517

[22] Filed: Jun. 11, 1993

Related U.S. Application Data

[62] Division of Ser. No. 994,436, Dec. 21, 1992, Pat. No. 5,241,212, which is a continuation of Ser. No. 689,325, Apr. 23, 1991, abandoned.

[30] Foreign Application Priority Data

May 1, 1990 [JP] Japan ..................................... 2-115640

[51] Int. Cl.⁶ .................................................. H01L 29/34
[52] U.S. Cl. ............................................ 438/132; 438/601
[58] Field of Search ........................... 437/922; 257/529; 438/132, 601

[56] References Cited

U.S. PATENT DOCUMENTS

| | | | |
|---|---|---|---|
| 4,455,194 | 6/1984 | Yabu et al. .............................. | 156/653 |
| 4,536,949 | 8/1985 | Takayama et al. ...................... | 437/922 |
| 4,602,420 | 7/1986 | Saito . | |
| 4,628,590 | 12/1986 | Udo et al. . | |
| 4,853,758 | 8/1989 | Fischer ................................... | 257/529 |
| 5,025,300 | 6/1991 | Billing et al. ........................... | 257/529 |
| 5,235,205 | 8/1993 | Lippitt, III ............................. | 257/529 |

FOREIGN PATENT DOCUMENTS

| | | |
|---|---|---|
| 0 128 675 | 5/1984 | European Pat. Off. . |
| 0 303 396 | 8/1988 | European Pat. Off. . |
| 59-117157 | 7/1984 | Japan . |

OTHER PUBLICATIONS

Chin–Yuan Lu, "Explosion of Poly–Silicide Links in Laser Programmable Redundance for VLSI Memory Repair", IEEE Transactions on Electron Devices, vol. 36, No. 6 (Jun. 1989).

IBM Technical Disclosure Bulletin, vol. 31, No. 12 (May, 1989), "Process and Structure for Laser Fuse Blowing".

Chlipapa et al., "Reliability Aspects of Laser Programmable Redundancy: Infrared vs. Green, Polysilicon vs. Silicide,", IEEE/IRPS 1989, pp. 163–170.

Patent Abstracts of Japan, No. 1–82652(A) for Manufacture of Semiconductor Device, E–787, Jul. 13, 1989, vol. 13/No. 307.

*Primary Examiner*—Jey Tsai
*Attorney, Agent, or Firm*—McDermott, Will & Emery

[57] ABSTRACT

A semiconductor device includes a specific circuit portion having a predetermined function and a spare redundant circuit portion having the same function as the specific circuit portion. The semiconductor device includes a silicon substrate (1), an interlayer insulating film (2), an LT fuse (3), interconnection layers (4), a testing electrode (5) and a protection film (6). The interlayer insulating film (2) has a groove (11) and is formed on the silicon substrate (1). The LT fuse (3) is formed of polysilicon and is located immediately below the bottom wall of the groove (11). The interconnection layers (4) are formed on the interlayer insulating film (2) with the groove (11) therebetween. The testing electrode (5) is spaced from the interconnection layers (4) and is formed on the interlayer insulating film (2). The protection film (6) is formed on the interlayer insulating film to cover surfaces of the interconnection layers (4) and expose a surface of the testing electrode (5). A laser beam is irradiated to a bottom wall of the groove (11) to fuse and remove a part of the LT fuse (3). This substitutes the specific part having a defect with the redundant circuit portion. In this operation, neither the interconnection layers (4) is damaged, nor short-circuit and breakage thereof are caused.

5 Claims, 10 Drawing Sheets

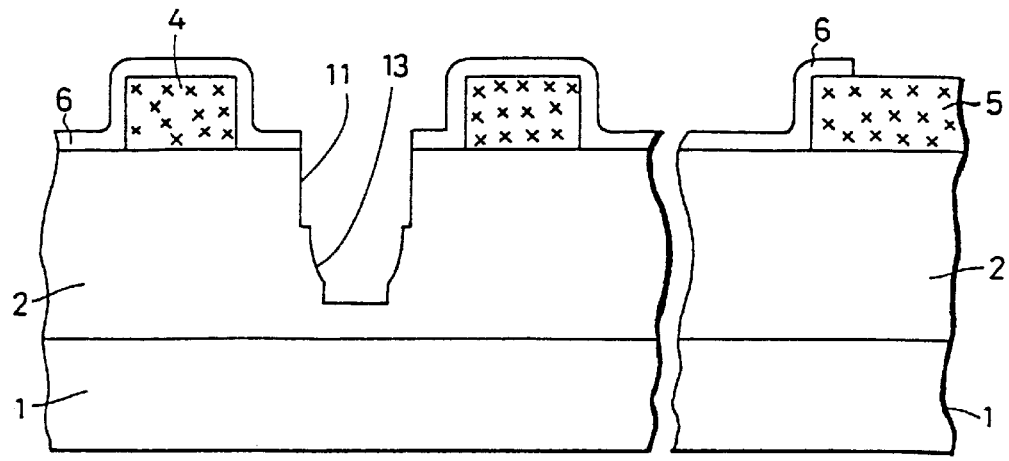
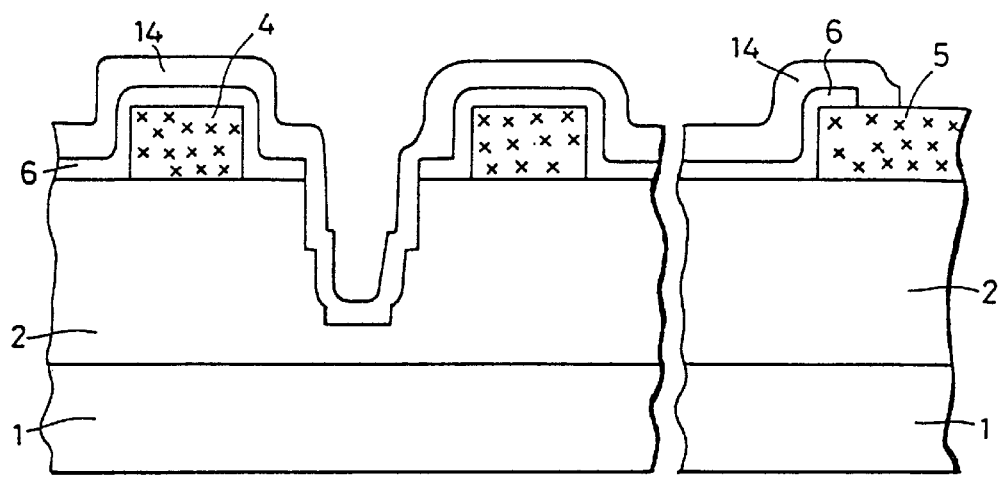
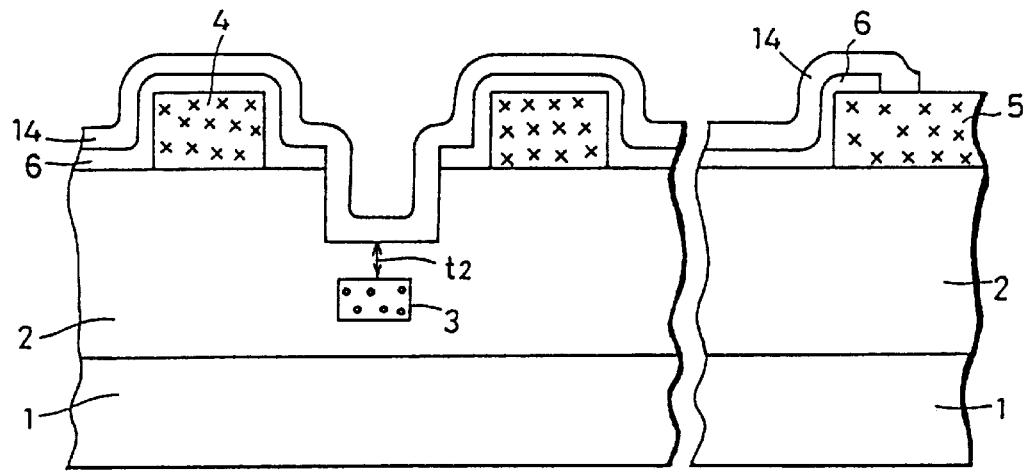

METHOD OF MANUFACTURING A SEMICONDUCTOR DEVICE HAVING A CIRCUIT PORTION AND REDUNDANT CIRCUIT PORTION COUPLED THROUGH A MELTABLE CONNECTION

This application is a Divisional application of application Ser. No. 07/994,436, filed Dec. 21, 1992, now U.S. Pat. No. 5,241,212 which is a continuation application of application Ser. No. 07/689,325, filed Apr. 23, 1991 abandoned.

BACKGROUND OF THE INVENTION

1. Field of the Invention

The present invention relates to a semiconductor device and a manufacturing method of the same, and particularly to a semiconductor device which includes at least a specific circuit portion having a predetermined function and a spare redundant circuit portion having the same function as the specific circuit portion as well as a connection which can be fused and removed for substituting the redundant circuit portion for a defective specific circuit portion, and a manufacturing method of the same.

2. Description of the Background Art

Generally, semiconductor devices such as static random access memories (SRAMs) and dynamic random access memories (DRAMs) incorporate redundant circuits so as to improve a manufacturing yield of the semiconductor devices. These redundant circuits are employed for preventing reduction of the yield of the semiconductor devices, which may be caused by random defects produced during manufacturing processes of the semiconductor devices. Redundancy is provided with respect to the specific circuit portion having a predetermined function, so that a few possible defects will not impair the function of the semiconductor device as a whole, owing to the redundant circuit portion formed to have the same function as the specific circuit portion. In order to replace the defective specific circuit portion with the redundant circuit portion, there is formed a connection which can be fused, i.e. melted and removed by a laser beam spot. The type of this redundant circuit is called an open loop formation type.

A constitution of the semiconductor device having redundant element structures of the open loop formation type described above will be schematically described. FIG. 5 is a top view illustrating a wafer in which semiconductor devices generally having the redundant circuits are formed as individual chips. FIG. 6 is a schematic view illustrating internal structures of the semiconductor device having the redundant circuit for each chip.

Referring to FIG. 5, the wafer 1000 includes a plurality of chips (semiconductor devices) 100. Referring to FIG. 6, each chip 100 includes blocks N1, N2, ..., Nm which have the same function, each including, for example, a plurality of memory cells having the same function in the semiconductor memory device. In order to activate these blocks N1, N2, ..., Nm, there are formed fuses (links L1, L2, ..., Lm) which can be blown. In order to replace any of the inactivated blocks N1, N2, ..., Nm, there is formed a redundant block S having the same function. The fuse (link) Ls can be blown for activating the redundant block S. A field effect transistor 106 serves as a switch for activating the redundant block S. For the execution of the switching function of this field effect transistor 106, there are provided a power supply 103, a resistor 104 and a ground power source 105. In order to detect possible defects in the respective blocks N1, N2, ..., Nm, there are formed testing pad electrodes 101 and 102 in a pad portion P.

The functional test of the semiconductor device constructed as described above will now be described. Generally, a predetermined circuit test is effected on the semiconductor device after integrated circuits are formed on a substrate such as a wafer through several steps. The wafer 1000 incorporating the chips 100 are processed for detecting the defect in accordance with following procedures. These processing procedures are generally called as a defective circuit repairing step. As executing means for it, there have be known a method in which processing is effected by flowing a predetermined electric signal and a method in which the processing is effected, using a laser beam spot together with an electric signal. Description herein will be made with respect to the latter case in which the processing is effected with the laser beam spot, i.e., a so-called laser trimming (will be also call as "LT" hereinafter) process.

This LT process is effected on the semi-finished wafer 1000, in which the chips have been formed. Specifically, the electric signal for the functional test is first applied to each chip 100 on the wafer 1000 through a testing pad electrode 101 in the pad portion P from a functional test device (not shown; will be called also as "tester"). If the chip 100 is non-defective, an expected signal corresponding to the applied electric signal is output from the testing pad electrode 102. In this operation, the tester determines whether the chip 100 to be processed is defective or not based on a correlation between the electric signal applied to the chip 100 and the output electric signal. If any of the blocks N1, N2, ..., Nm is determined to be defective, the defective block will be replaced with the redundant block S so that the chip 100 will have the intended function to be achieved. Thus, the chip 100 determined to be defective can have a possibility to become non-defective owing to the existence of the redundant block S.

The replacement of the defective block with the redundant block is performed as follows. A potential at the ground power supply 105 is applied to a gate electrode of the field effect transistor 106, whereby the field effect transistor 106 is maintained to be non-conductive. Thereby, the redundant block S is electrically isolated in the chip 100. The LT process is executed in this condition. As a result thereof, if the block, e.g., N1 in chip 100 is determined to be defective, this defective block N1 is replaced with the redundant block S in the following manner.

In this case, upon detection of the defect in the block N1 by the tester, information relating to the fuses L1 and Ls in the chip 100, in other words, a defective address or position coordinate in the chip and others (i.e., replacement information) are first applied to the LT processing device. This LT processing device operates on the basis of the replacement information to fuse and remove the fuses L1 and Ls by irradiation of the laser beam. By fusing the fuse L1, the defective block N1 is isolated in the chip 100. By fusing the fuse Ls, the voltage of the power supply 103 is applied through the resistor 104 to the gate electrode of the field effect transistor 106. This makes the field effect transistor 106 conductive. Thus, the defective block N1 is replaced with the redundant block S.

Description will be made with respect to an example in which the semiconductor device having the above redundant circuit is a DRAM, and particularly to a case in which blocks having the predetermined functions are memory cell arrays. FIG. 7 is a schematic diagram illustrating structures of a memory cell array in a conventional DRAM. Referring to FIG. 7, the memory cell array 50 is provided with a plurality of word lines WL extending in a row direction and a plurality of bit lines BL extending in a column direction and crossing the word lines WL. A memory cell MC is arranged at an intersection between each word line WL and each bit line BL. A plurality of row decoders 51 are provided corresponding to the word lines WL, respectively. Each row decoder 51 is connected through a word driver 52 to the corresponding word line WL. A plurality of column decoders 53 are provided corresponding to the bit lines BL, respectively.

A spare word line SWL is disposed outside the word lines WL. A spare memory cell SMC is arranged at an intersection between the spare word line SWL and each bit line BL. A spare decoder 54 is provided corresponding to the spare word line SWL. The spare decoder 54 is connected through a spare word driver 55 to the spare word line SWL. These spare word lines SWL, spare decoder 54 and spare word driver 55 form the so-called redundant circuit.

Now, the function of the redundant circuit in the DRAM will be described. The redundant circuit is incorporated in the DRAM for improving the yield of the memory cells in the DRAM. Referring to FIG. 8, description will be given with respect to a memory circuit characteristic test of the DRAM and a defective circuit repairing method using the redundant circuit. First, an operational test is effected on the DRAM with the tester device or others to detect a defective bit MC1 in the memory cell array 50. Then, a fuse FU1 of a word line WL1 including this defective bit MC1 is blown to isolate the defective word line WL1 from the circuit. Then, fuses SFU connected to the spare line SWL of the redundant circuit are selectively blown in a certain combination to form the circuit in such a manner that the spare line SWL will operate only when a signal selecting the defective bit MC1 is entered as an address signal from the exterior. In this manner, by connecting the spare line included in the redundant circuit to the primary line, the DRAM having the defect can be repaired to the non-defective DRAM. The fuses FU1 and SFU are blown by the LT process described before.

Then, the LT-process will be specifically described. FIGS. 9A–9C are cross sections of the semiconductor device for illustrating, in this order, the steps in the LT process. Referring to FIG. 9A, the silicon substrate 1 is covered with an interlayer insulating film 2 formed of an oxide film. A polysilicon layer (LT fuse) 3 to which the above LT process is applied is embedded in this interlayer insulating film 2. Interconnection layers 4 formed of aluminum or the like are formed on the interlayer insulating film 2 at a final manufacturing step of the semiconductor device. The polysilicon layer 3 is located at a region between the interconnection layers 4. Apart from the interconnection layers 4, there is formed on the interlayer insulating film 2 a testing pad electrode 5 to be used in the above functional test. This testing pad electrode 5 is formed of aluminum. The polysilicon layer 3 which can be fused and removed is located at a depth t1 of 1 μm or more from the surface of the interlayer insulating film 2. The left-hand area in the figure is illustrated as the link portion L which is a region for forming the LT fuse, and the right-hand portion is illustrated as the pad portion P which is a region for forming the electrode used in the functional test.

Referring to FIG. 9B, an electrode terminal of the tester is pressed on [ ] to the surface of the testing pad electrode 5 for detecting the possible defect in the circuit. If the defective portion in the circuit is detected, in accordance with a predetermined logic, the laser beam spot 12 is irradiated to the LT fuse 3 provided in the redundant circuit. This laser beam spot 12 irradiates that region of the interlayer insulating film 2 in which the polysilicon layer 3, i.e., LT fuse is embedded. The laser beam spot 12 irradiated toward the polysilicon layer 3 passes through the interlayer insulating film 2 to the polysilicon layer 3. Thereby, the polysilicon layer 3 absorbs the heat caused by the laser irradiation, and it melts. In this operation, rapid increase of the temperature is caused particularly in the upper portion of the polysilicon layer 3 so that the pressure increases, and thereby the interlayer insulating film 2 over the polysilicon layer 3 is blown off. This reduces the pressure nearly to an atmospheric pressure, and simultaneously, the melted polysilicon layer 3. vaporizes, so that the LT fuse can be blown. This condition is illustrated in FIG. 9C. Also, FIG. 9D illustrates as a perspective view the LT fuse 3 which is partially fused and removed.

In FIG. 9C, when the LT fuse is removed by the vaporization, a part of the vaporized LT fuse forms a silicon contained dust 31, which scatters onto portions of the interconnection layers 4 on the interlayer insulating film 2, as indicated by an arrow. This causes problems such as short-circuit between interconnections.

Further, the polysilicon layer 3, i.e., LT fuse is formed at the depth t1 of 1 μm or more from the surface of the interlayer insulating film 2. Therefore, after the thick interlayer insulating film 2 over the polysilicon layer 3 is blown off by the pressure increased in accordance with the elevation of the temperature by the laser irradiation, a concave or crater 21 is formed. A larger thickness of the interlayer insulating film 2 over the polysilicon layer 3, i.e., a larger value of t1 will increase the sizes of the crater 21. If the crater 21 reaches the regions for the interconnection layers 4, the interconnection layers 4 are damaged and broken.

SUMMARY OF THE INVENTION

An object of the invention is to prevent disconnections in a laser trimming process.

Another object of the invention is to prevent short-circuit of an interconnection in a laser trimming process.

Still another object of the invention is to provide structures of a semiconductor device in which an interconnection layer is not damaged in a laser trimming process.

A further object of the invention is to manufacture a semiconductor device capable of preventing disconnection of an interconnection in the laser trimming process.

A still further object of the invention is to manufacture a semiconductor device capable of preventing short-circuit of an interconnection in the laser trimming process.

Yet a further object of the invention is to form structures of a semiconductor device in which an interconnection layer is not damaged in a laser trimming process.

A semiconductor device according to the invention comprises a semiconductor substrate, an insulator layer, a connection conductive layer, interconnection layers, a testing electrode and a protection film. The insulator layer is formed on a main surface of the semiconductor substrate and has a concave portion. The connection conductive layer is formed of polysilicon and is located immediately below a bottom wall of the concave portion. The interconnection layers are formed on the insulator layer and are equally spaced from each other with the concave portion therebetween. The testing electrode is formed at a region on the insulator layer spaced from the interconnection layers. The protection film is formed on the insulator layer to cover surfaces of at least the interconnection layers and to expose a surface of the testing electrode.

In a manufacturing method of the semiconductor device according to the invention, interconnection layers and a testing electrode spaced from the interconnection layers are first formed on an insulator layer which is formed on a main surface of a semiconductor substrate, and in which the connection conductive layer is embedded. The interconnection layers formed on the insulator layer are spaced from each other with a region of the connection conductive layer positioned therebetween. A concave portion is formed on the insulator layer between the interconnection layers to have a bottom wall thereof located immediately above the connection conductive layer. The polysilicon layer is formed on the insulator layer to cover surfaces of the interconnection layers and to expose a surface of at least testing electrode.

According to the invention, the connection conductive layer is formed immediately below the bottom wall of the concave portion in the insulator layer. A laser beam spot is irradiated toward the bottom wall of this concave portion, so that the connection conductive layer formed of polysilicon is fused and removed. In this operation, the connection conductive layer absorbs heat generated by the laser irradiation, and it melts. Since the connection conductive layer is formed immediately below the bottom wall of the concave portion, a large crater is not formed even if the insulator layer is partially blown off as the connection conductive layer is fused and removed due to the temperature elevated by the laser irradiation and thus the increased pressure. Therefore, the interconnection layers formed on the insulator layer with the concave portion therebetween will not be damaged to break.

Further, the polysilicon which forms the connection conductive layer partially scatters as a silicon contained dust due to the increase of the pressure caused by the laser irradiation. In this operation, since the surfaces of the interconnection layers are covered with the protection film, short-circuit between interconnections is not caused even if the silicon contained dust scatters onto the interconnection layers. Since the surface of the testing electrode is exposed, this protection film will not cause any inconvenience in the application of the electric signal during the functional test.

According to the invention, as described hereinabove, the bottom wall of the concave portion in the insulator layer is formed immediately above the connection conductive layer. The insulator layer and the connection conductive layer are blown off when the laser beam spot is irradiated toward this connection conductive layer for fusing and removing the same. Since the connection conductive layer to be fused and removed is formed immediately below the bottom wall of the concave portion in the insulator layer, the blowing off of the insulator layer does not form a large crater. Thus, the interconnection layers are not damaged and broken. Further, since the surfaces of the interconnection layers are covered with the protection film, the short-circuit between the interconnection layers is not caused even if the dust of the connection conductive layer scatters onto the interconnection layers. Therefore, it is possible to provide structures of the semiconductor device in which the laser trimming process does not damage the interconnection layers. Thereby, the semiconductor device having a good manufacturing yield and reliability can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B, 3C, 3D, 3E and 3F are cross sections illustrating a manufacturing method of a semiconductor device having structures shown in FIG. 2A in accordance with the order of process steps including a laser trimming step;

DESCRIPTION OF THE PREFERRED EMBODIMENTS

Embodiments of the invention will be described in greater detail.

Figure 1:
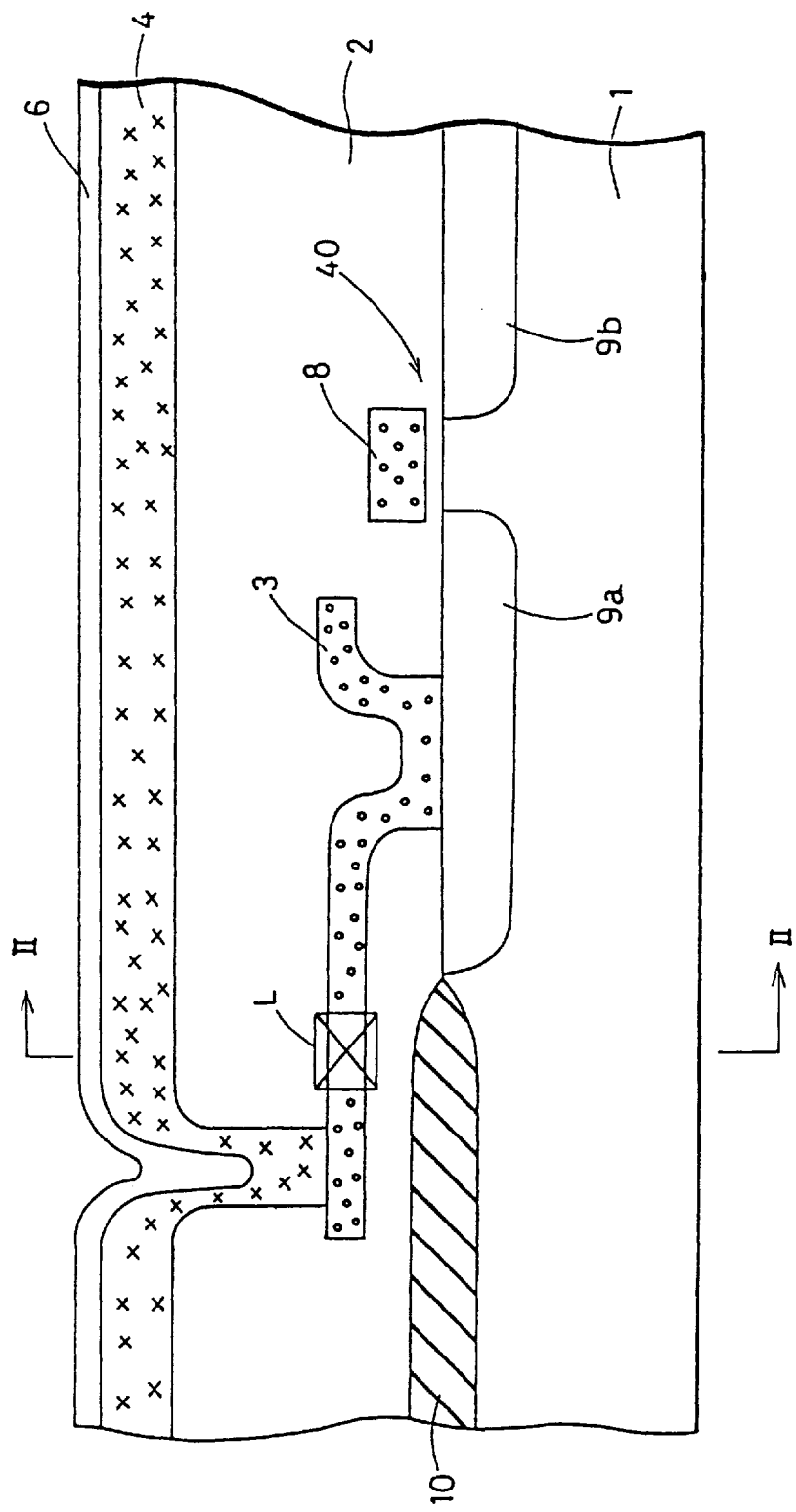
FIG. 1 is a cross section illustrating a semiconductor device provided with a connection conductive layer according to the invention.

Referring to FIG. 1, a field effect-transistor 40 which constitutes memory cells or the like is formed on a silicon substrate 1. This field effect transistor 40 has a gate electrode 8 and impurity regions 9a and 9b. The gate electrode 8 is formed on the silicon substrate 1 with a gate insulator film posed therebetween. The impurity regions 9a and 9b are formed in regions in the silicon substrate 1 spaced from each other with the gate electrode 8 posed therebetween. In this embodiment, a polysilicon layer 3, i.e., LT fuse is in electrical contact with and is connected to one of the impurity regions 9a. This polysilicon layer 3 is formed to extend over a separation oxide film 10. An interlayer insulating film 2 is formed over the polysilicon layer 3. In the interlayer insulating film 2, there is formed a specific circuit portion such as memory cells having a predetermined function. On the interlayer insulating film 2, there is formed interconnection layers 4 of aluminum which is connected to, e.g., the polysilicon layer 3. These interconnection layers 4 are covered with a protection film 6. In these structures, a link part L which can be fused and removed for replacement with a redundant circuit is formed in a predetermined position in the polysilicon layer 3.

Figure 2A:
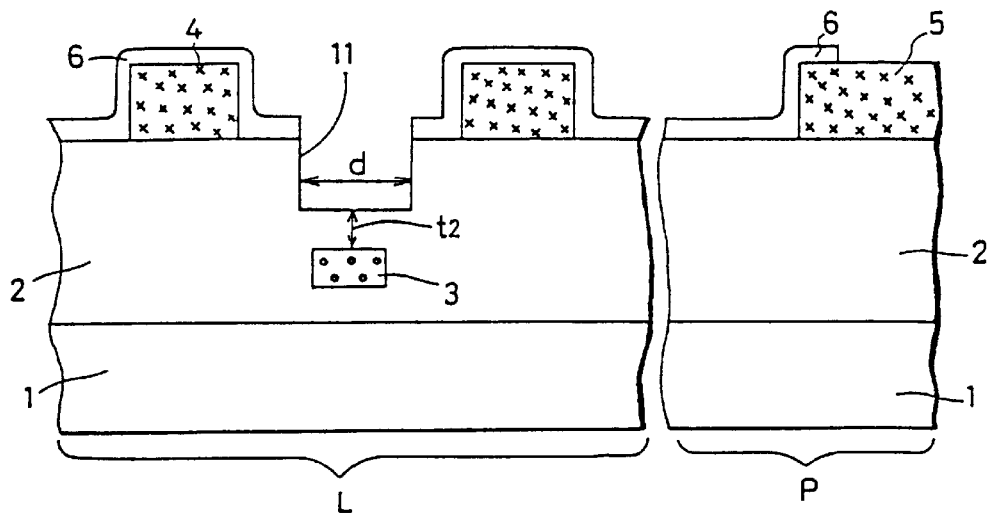
FIGS. 2A, 2B and 2C are cross sections illustrating respective embodiments of sectional structures taken along the line II—II in FIG. 1.

As shown in FIG. 2A, in the link part L, the interlayer insulating film 2 is provided with a groove 11 having a depth of about 8000 Å–1 μm. The polysilicon layer 3 to be fused and removed is formed at a position separated from a bottom wall surface of this groove 11 by a distance t2 of about 6000–8000 Å. The interconnection layers 4 formed on the interlayer insulating film 2 are located at opposite sides of this polysilicon layer 3. On the other hand, in a region of a pad portion P, a testing pad electrode 5 formed of aluminum is disposed as an electrode to be used in a predetermined functional test. The surfaces of the interconnection layers 4 are covered with a lower layer protection film 6. This lower layer protection film 6 is formed on the interlayer insulating film 2 in such a manner that the surface of the testing pad electrode 5 is partially exposed in the region of the pad portion P.

Figure 2B:
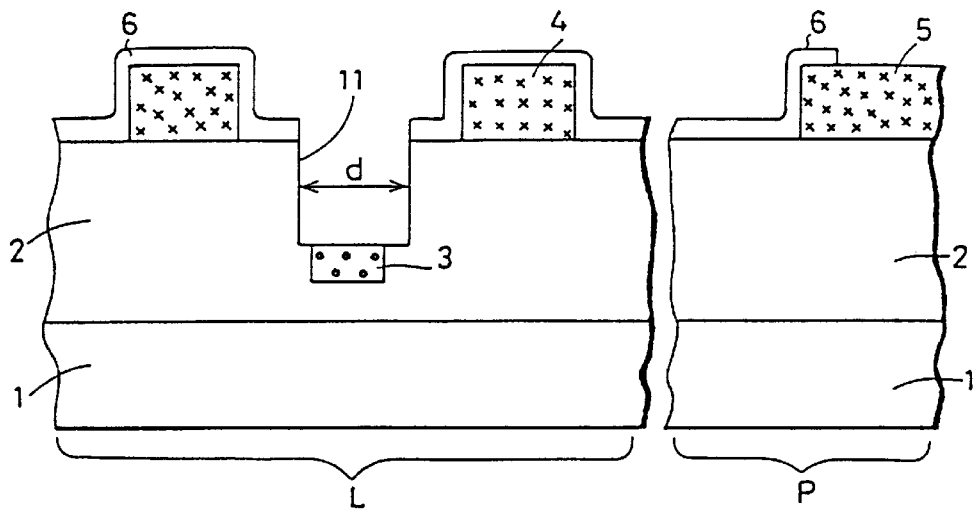
Figure 2C:
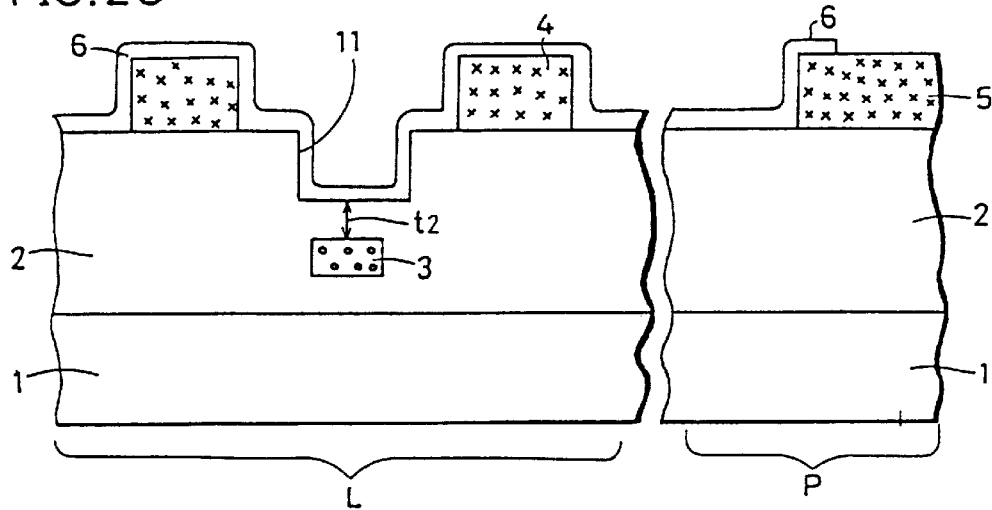

The polysilicon layer 3 may be so formed that the surface thereof is exposed at a bottom of the groove 11, as shown in FIG. 2B. Also, as shown in FIG. 2C, the side walls and bottom wall of the groove 11 may be covered with the lower layer protection film 6. The lower layer protection film 6 is formed of a nitride film or an oxide film formed by a plasma CVD method. An inner diameter d of the groove 11 is about 3–5 μm. FIGS. 2A–2C illustrate structures before a laser trimming process.

A manufacturing method of the semiconductor device including a laser trimming step will be described below.

Figure 3A:
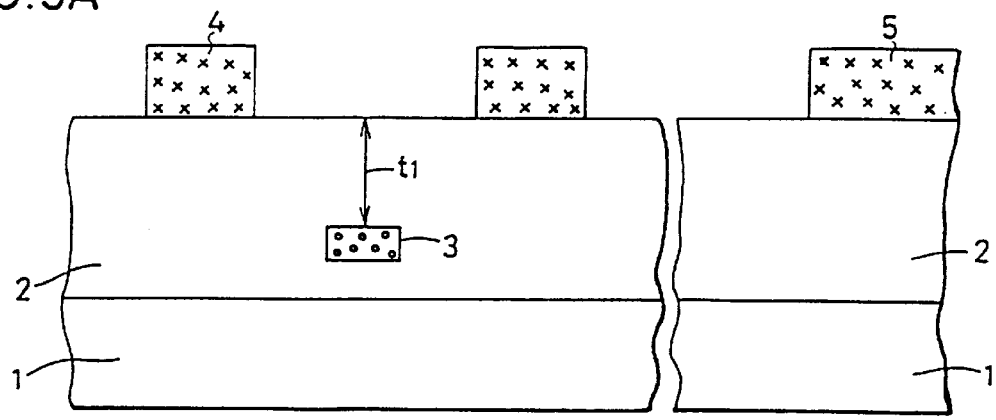

Referring to FIG. 3A, the interlayer insulating film 2 in which the polysilicon layer 3, i.e., LT fuse is embedded, is formed on the silicon substrate 1. A circuit block such as memory cells having a predetermined function is formed in advance in this interlayer insulating film 2. Therefore, the interlayer insulating film 2 having a large thickness is deposited so as to form a flat surface. Accordingly, the embedded polysilicon layer 3 is spaced from the surface of the interlayer insulating film 2 by the distance t1 of 1 μm or more. On the interlayer insulating film 2, there are formed the interconnection layers 4 of aluminum or the like in the regions at opposite sides of the polysilicon layer 3. The testing pad electrode 5 used as an electrode to which an electric signal is applied in the functional test is formed on the interlayer insulating film 2.

Figure 3B:
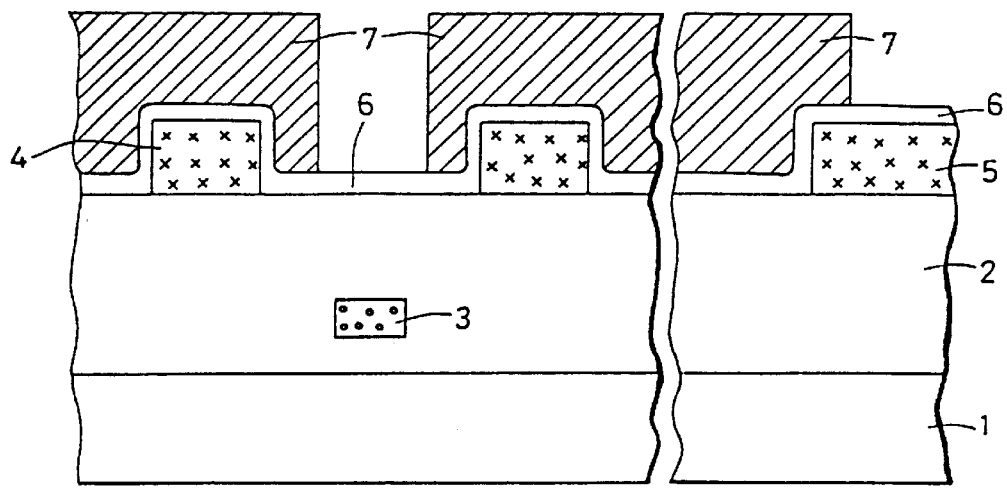

Referring to FIG. 3B, the lower layer protection film 6 is formed by plasma nitrization or plasma oxidation to cover the whole surfaces of the interlayer insulating film 2, interconnection layers 4 and testing pad electrode 5. A resist film 7 is formed on this lower layer protection film 6. This resist film 7 is so formed that it exposes a region immediately above a portion of the polysilicon layer to be fused and removed. This resist film 7 is also formed so that it exposes a surface of at least the lower layer protection film 6 formed on the testing pad electrode 5. This resist film 7 is used as a mask for an etching process by which the lower layer protection film 6 and the interlayer insulating film 2 are selectively removed. In this etching process, the selectivity is determined so that the etching of the interlayer insulating film 2 and the lower layer protection film 6 is promoted and the etching of the testing pad electrode 5 is suppressed.

Figure 3C:
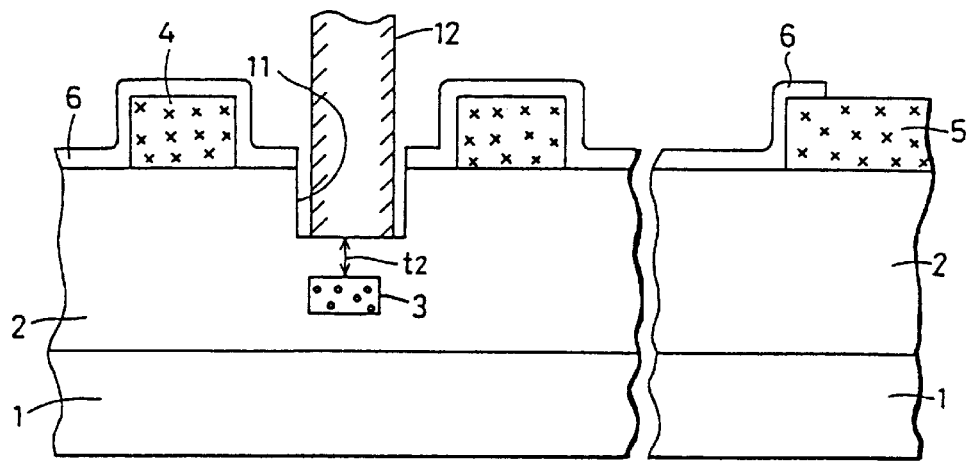

As a result, as shown in FIG. 3C, the groove 11 having a bottom wall located above the polysilicon layer 3 is formed in the interlayer insulating film 2. The etching is controlled so that the bottom wall surface of the groove 11 may be located at the position spaced from the upper surface of the polysilicon layer 3 by the distance t2 of about 6000–8000 Å. Thus, the structures shown in FIG. 2A are completed. It should be noted that the groove 11 may be formed to expose the upper surface of the polysilicon layer 3 (see FIG. 2B).

In this stage, a circuit test is executed as a functional test. In the circuit test, an electrode terminal of a tester is pressed onto the surface of the testing pad electrode 5 to detect a possible defect in the circuit. If a defective section in the circuit is detected, in accordance with the predetermined logic, the polysilicon layer 3, i.e., LT fuse arranged in the redundant circuit is fused and removed. This fusing and removing of the polysilicon layer 3 is effected, as shown in FIG. 3C, by the irradiation of a laser beam spot 12 onto the bottom surface of the groove 11. This laser trimming is effected with a spot controlled in such a manner that the laser beam having an energy of about 1 μJ may have a diameter of about 5 μm.

The laser thus irradiated toward the LT fuse passes through the interlayer insulating film 2 to the polysilicon layer 3. Owing to this laser irradiation, the polysilicon layer 3 absorbs the heat and it melts. In this operation, the rapid elevation of the temperature at the upper portion of the polysilicon layer 3 causes the increase of the pressure. Therefore, the interlayer insulating film 2 is blown off, so that the pressure decreases to a value nearly the same as the atmospheric pressure, and simultaneously, the melted polysilicon layer 3 is removed owing to vaporization.

Consequently, as shown in FIG. 3D, a crater 13 continuous to side walls of the groove 11 is formed. Since the interlayer insulating film 2 blown off by the laser irradiation is thinner than the conventional structure, a large crater is not formed. Thus, such a crater that may damage the interconnection layers 4 located at opposite sides of the groove 11 is not formed. Further, even if the vaporized polysilicon layer 3 partially forms a silicon contained dust which is scattered onto the interlayer insulating film 2, a problem of short-circuit between the interconnection layers 4 is not caused because the surfaces of the interconnection layers 4 are covered with the lower layer protection film 6.

Thereafter, the predetermined electric signal is applied to the testing pad electrode 5 to detect and confirm the replacement with the predetermined redundant circuit owing to the blowing and removing of the LT fuse.

Referring to FIG. 3E, an upper layer protection film 14 formed of a plasma nitride film is disposed in such a manner that it exposes the surface of at least the testing pad electrode 5 and to cover the lower layer protection film 6. As shown in FIG. 3F, the upper layer protection film 14 is also formed over a region in which the polysilicon layer 3 exists for the LT fuses which are not fused nor removed. This upper layer protection film may be used to fill the groove 11.

Then, another embodiment of a manufacturing method of the semiconductor device according to the invention will be described below.

Figure 4A:
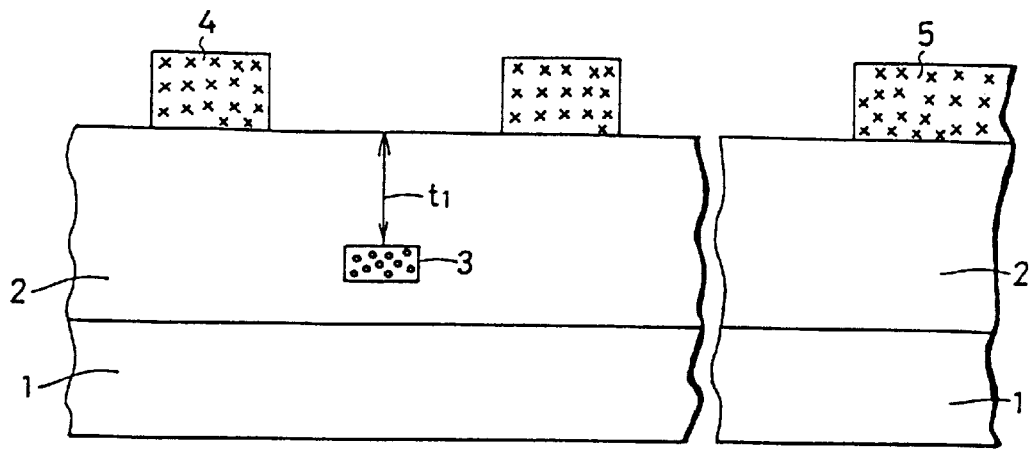
FIGS. 4A, 4B, 4C, 4D and 4E are cross sections illustrating a-manufacturing method of a semiconductor device having structures shown in FIG. 2C in accordance with the order of process steps including a laser trimming step.

Referring to FIG. 4A, the polysilicon layer 3, i.e., LT fuse, interconnection layers 4 and testing pad electrode 5 are formed in a manner similar to that in FIG. 3A.

Figure 4B:
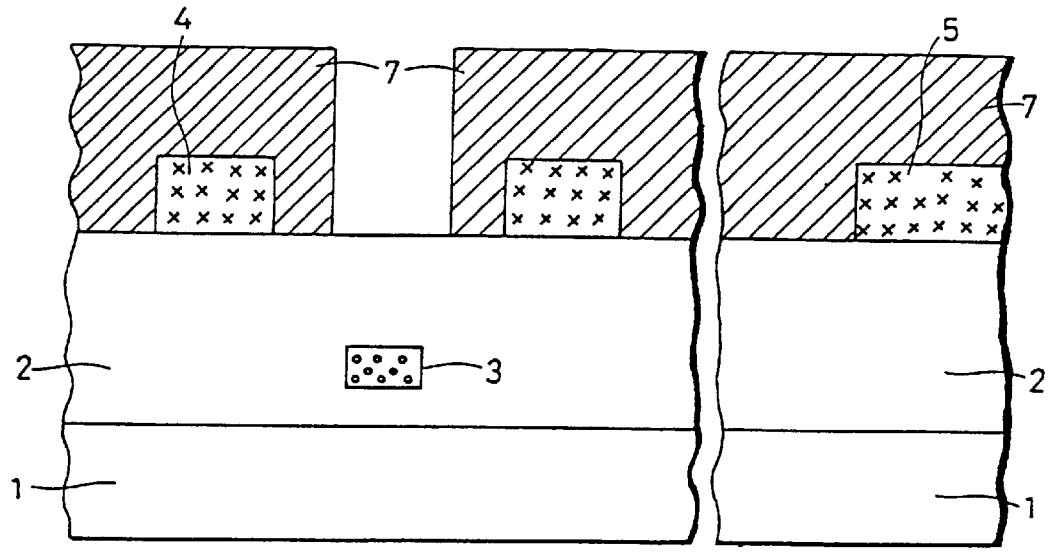

Referring to FIG. 4B, the resist film 7 is formed in such a manner that it exposes only the surface of the interlayer insulating film 2 in the region in which the polysilicon layer 3 is embedded. This resist film 7 is used as the mask for the etching process to effect selective removal of the interlayer insulating film 2.

Figure 4C:
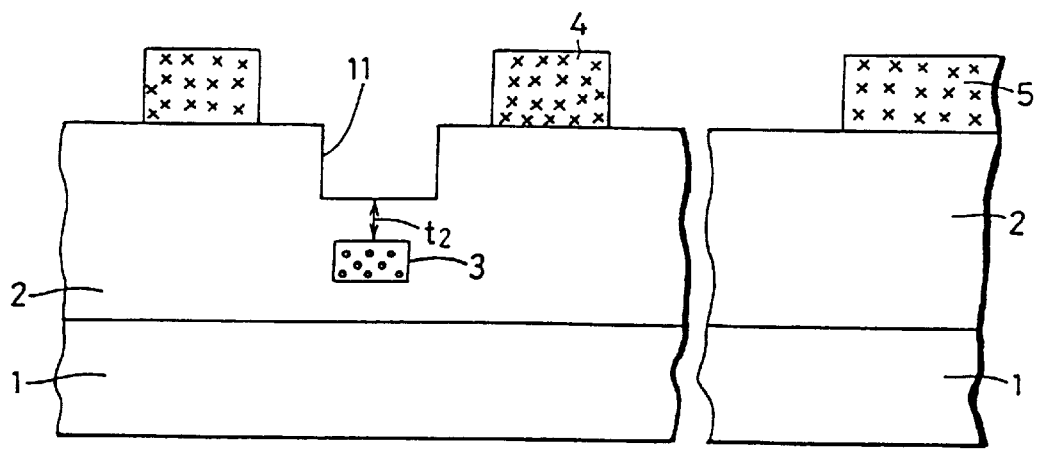

As shown in FIG. 4C, the groove 11 located between the interconnection layers 4 is formed in the interlayer insulating film 2 so that the bottom surface thereof is spaced from the upper surface of the polysilicon layer 3 by the distance t2 of about 6000–8000 Å.

Figure 4D:
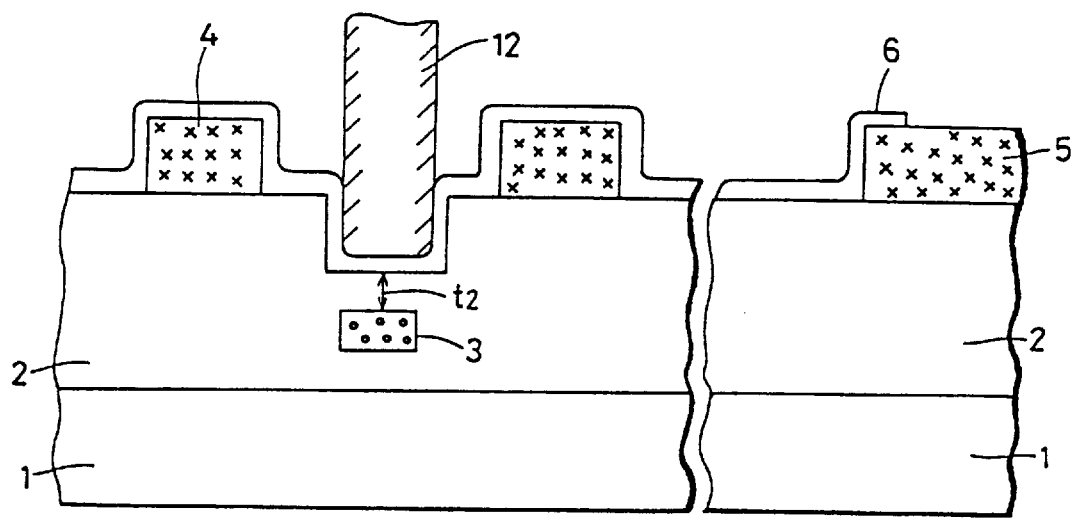

Thereafter, as shown in FIG. 4D, the lower layer protection film 6 is formed in such a manner that it exposes at least the surface of the testing pad electrode 5. The electrode terminal of the tester is pressed onto the exposed surface of the testing pad electrode 5 to detect the possible defect in the circuit. If a defective section is detected in the circuit, in accordance with the predetermined logic, the laser trimming process is effected on the portion of the LT fuse to be blown. As shown in FIG. 4D, the laser beam spot 12 is irradiated from above to the polysilicon layer 3, i.e., LT fuse.

Figure 4E:
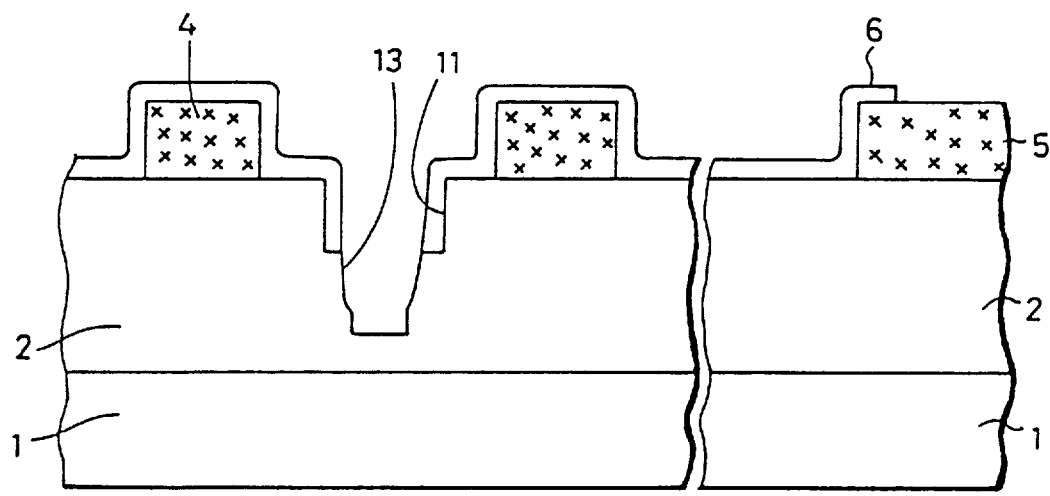
Figure 5:
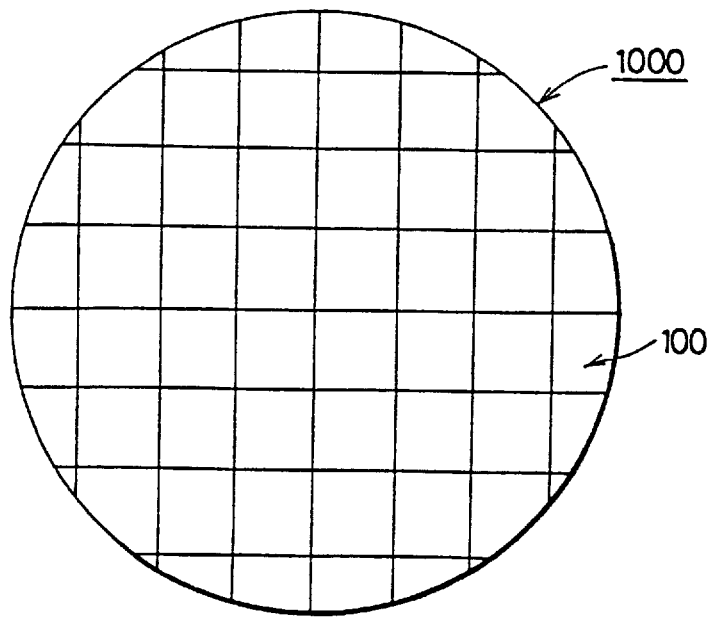
FIG. 5 is a top view of a wafer generally including a plurality of semiconductor devices provided with redundant circuits.
Figure 6:
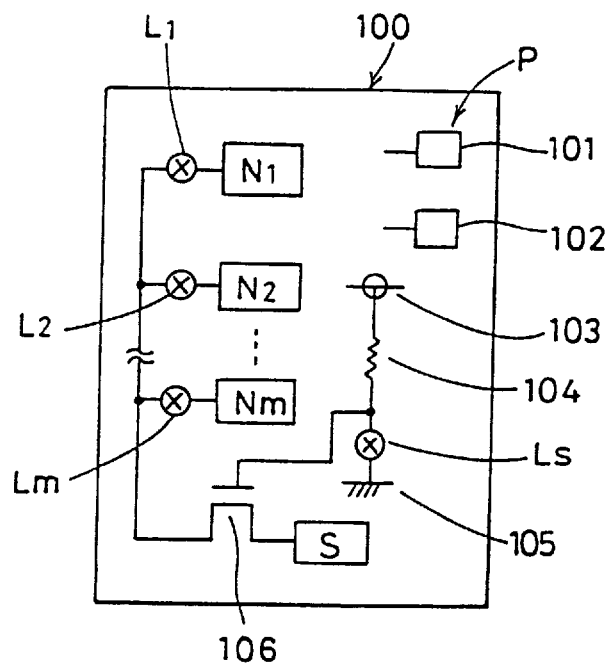
FIG. 6 is a schematic view illustrating internal structures of a semiconductor device generally including chips respectively provided with redundant circuits.
Figure 7:
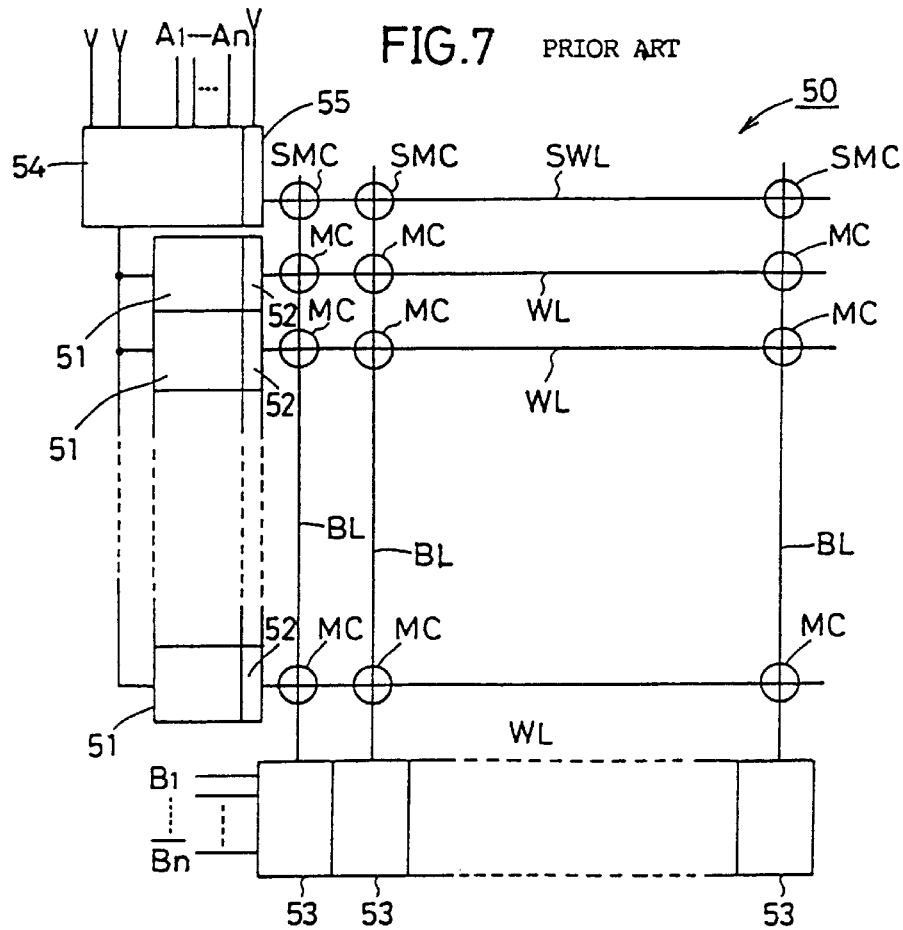
FIG. 7 is a block diagram illustrating a memory cell array in a DRAM generally including a redundant circuit as well as a peripheral portion.
Figure 8:
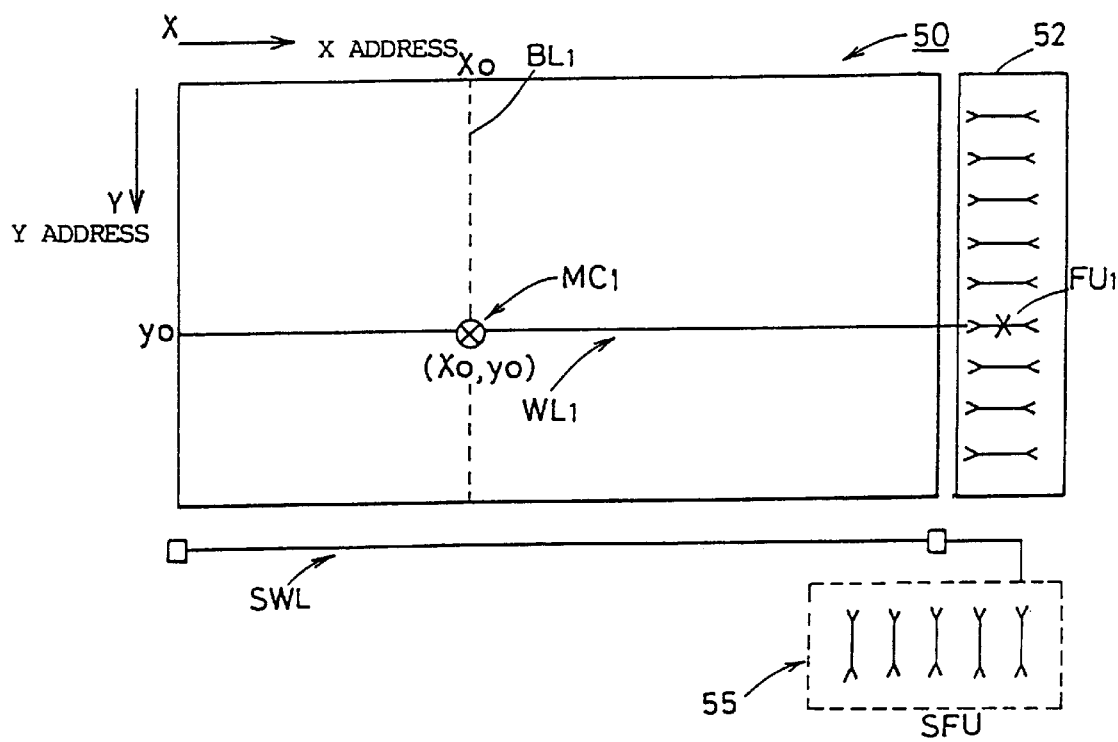
FIG. 8 is a schematic view for illustrating an example of a redundant circuit in a DRAM.
Figure 9A:
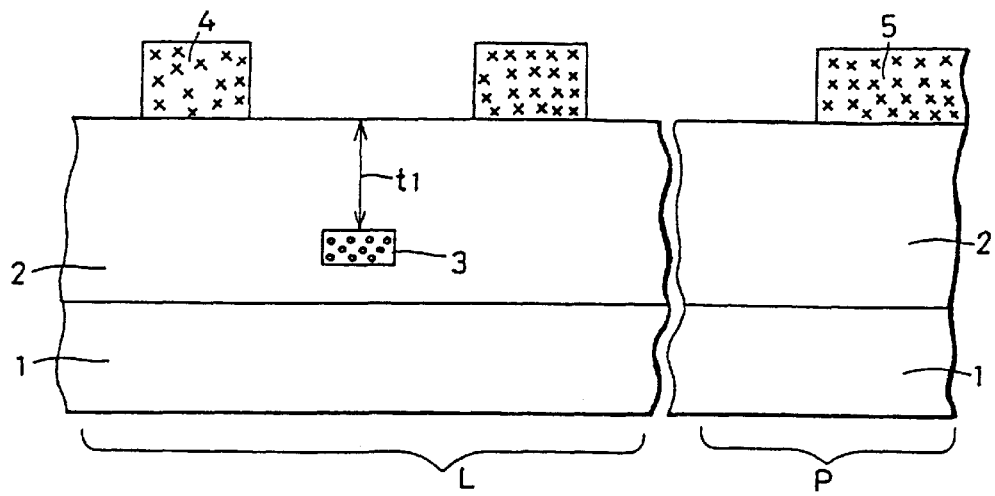
FIGS. 9A, 9B and 9C are cross sections illustrating, in this order the laser trimming process for a conventional semiconductor device provided with a connection conductive layer.
Figure 9B:
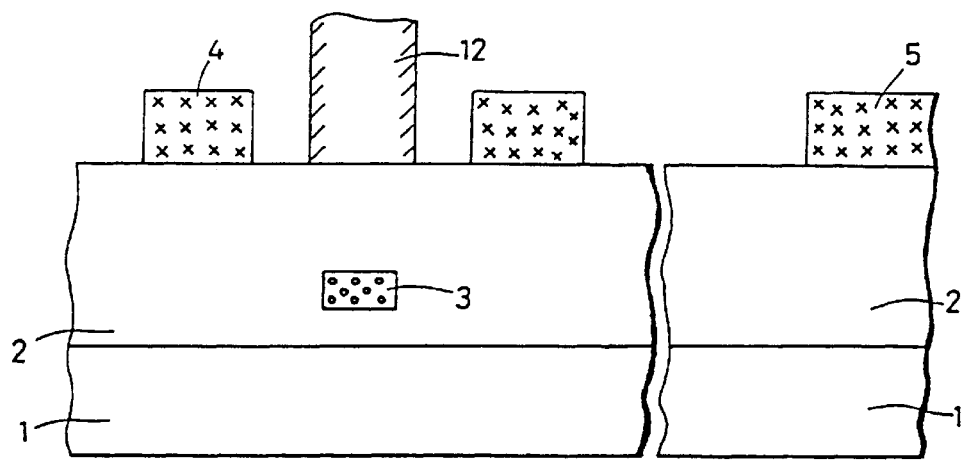
Figure 9C:
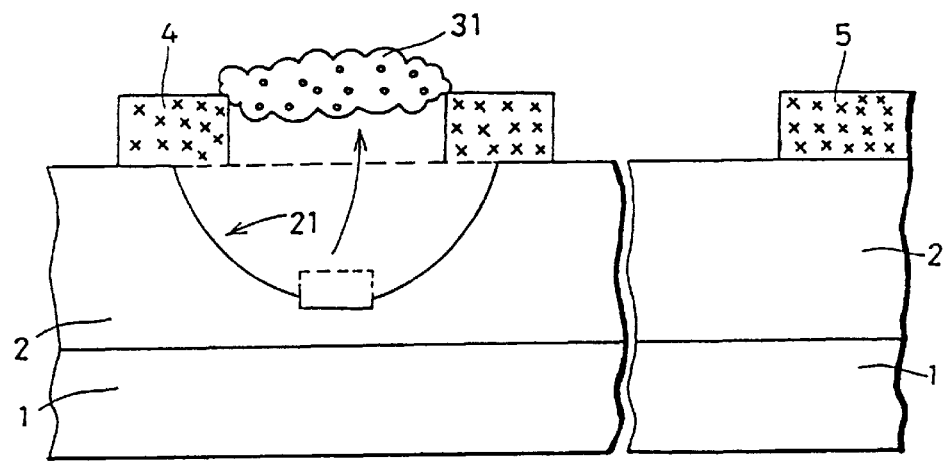
Figure 9D:
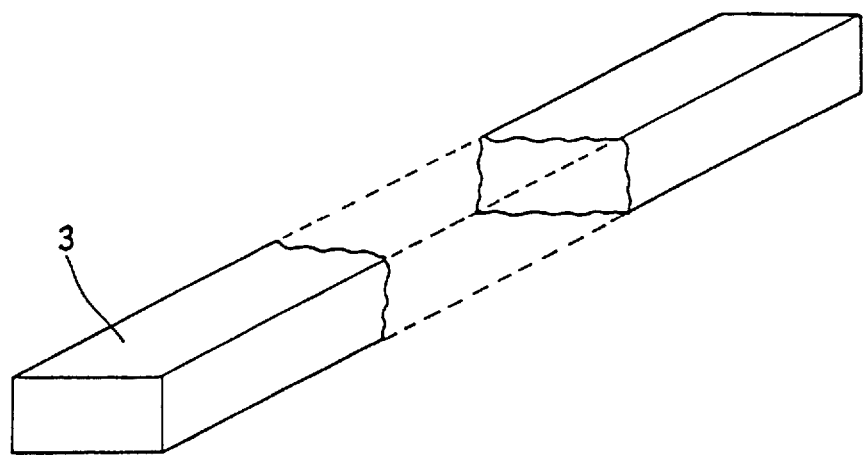
FIG. 9D is a perspective view illustrating an LT fuse which is partially fused and removed by laser trimming.

As a result, as shown in FIG. 4E, the crater 13 is formed due to blowing off of the polysilicon layer 3 and the interlayer insulating film 2 over the same. Since the lower layer protection film 6 is formed in advance on the side walls of the groove 11, the interconnection layers 4 which are disposed on the interlayer insulating film 2 is not damaged. The lower layer protection film 6 formed on the side walls of the groove 11 serves as a stopper against the blowing off of the interlayer insulating film 2 and the polysilicon layer 3 by irradiation of the laser beam.

After the laser trimming process, the electrode terminal of the tester is pressed onto the testing pad electrode 5 to confirm the replacement of the defective circuit with the predetermined redundant circuit. Then, the upper protection film 14 is formed in a manner similar to the step in FIG. 3E.

It should be understood that the invention is applicable to various semiconductor devices, such as SRAMs and DRAMs, which are constituted to disconnect predetermined link portions for the replacement of the defective circuit blocks with the spare redundant circuit blocks, and thus have redundant element structures of the open loop formation type.

According to the invention, as described hereinabove, the bottom wall of the concave portion in the insulator layer is formed immediately above the connection conductive layer. The insulator layer and the connection conductive layer are blown off when the laser beam spot is irradiated toward this connection conductive layer for fusing and removing the same. Since the connection conductive layer to be fused and removed are formed immediately below the bottom wall of the concave portion in the insulator layer, the blowing off of the insulator layer does not form a large crater. Thus, the interconnection layers are not damaged and broken. Further, since the surfaces of the interconnection layers are covered with the protection film, the short-circuit between the interconnection layers is not caused even if the dust of the connection conductive layer scatters onto the interconnection layers. Therefore, it is possible to provide structures of the semiconductor device in which the laser trimming process does not damage the interconnection layers. Thereby, the semiconductor device having a good manufacturing yield and reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device which includes at least a specific circuit portion and a spare redundant circuit portion having the same function as said specific circuit portion as well as a connection which can be fused and removed for replacing a defective specific circuit portion with said redundant circuit portion, said method comprising the steps of:

forming interconnection layers and a testing electrode on an insulator layer formed on a main surface of a semiconductor substrate, said interconnection layers being spaced from each other and located at opposite sides of a region of a connection conductive layer embedded in and completely covered by said insulator layer, and a testing electrode being spaced from said interconnection layers;

forming a concave portion which is located in said insulator layer between said interconnection layers and has a final bottom wall, formed of said insulator layer, located immediately above said connection conductive layer; and forming a protection film on said insulator layer so as to cover surfaces of at least said interconnection layers, and expose a surface of said testing electrode.

2. A manufacturing method of a semiconductor device according to claim 1, further comprising the step of:

fusing and removing a part of said connection conductive layer by irradiating the final bottom wall of said concave portion with a laser beam.

3. A manufacturing method of a semiconductor device according to claim 2, further comprising the step of:

forming an additional protection film for covering a crater which is formed by fusing and removing of said connection conductive layer.

4. A manufacturing method of a semiconductor device according to claim 2, wherein said step for forming said protection film includes forming said protection film over said bottom wall and a side wall of said concave portion.

5. A manufacturing method of a semiconductor device according to claim 4, wherein said step for fusing and removing said part of said connection conductive layer includes irradiating said laser beam onto said protection film formed on said final bottom wall of said concave portion.

* * * * *